(12) United States Patent
Nakashiba

(10) Patent No.: US 6,380,005 B1
(45) Date of Patent: Apr. 30, 2002

(54) CHARGE TRANSFER DEVICE AND METHOD FOR MANUFACTURING THE SAME

(75) Inventor: Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/545,890

(22) Filed: Apr. 7, 2000

Related U.S. Application Data

(62) Division of application No. 09/106,005, filed on Jun. 29, 1998, now Pat. No. 6,097,044.

(30) Foreign Application Priority Data

Jun. 27, 1997 (JP) .................................. 9-172387

(51) Int. Cl.$^7$ .................. H01L 21/00; H01L 21/339
(52) U.S. Cl. ................ 438/144; 438/146; 438/148; 438/60; 438/77; 438/79
(58) Field of Search ................... 438/148, 147, 438/146, 145, 144, 60, 77, 78, 79, 76, 75, 587, 588, 589; 257/221, 248, 219, 227

(56) References Cited

U.S. PATENT DOCUMENTS

| | | | |
|---|---|---|---|
| 3,852,799 A | | 12/1974 | Walden |
| 4,992,842 A | | 2/1991 | Yang et al. |
| 5,065,203 A | | 11/1991 | Yang et al. |
| 5,221,852 A | | 6/1993 | Nagai et al. |
| 5,289,022 A | | 2/1994 | Iizuka et al. |
| 5,315,137 A | | 5/1994 | Asaumi et al. |
| 5,442,208 A | | 8/1995 | Bosiers et al. |
| 5,488,010 A | * | 1/1996 | Wong ......................... 437/53 |
| 5,607,872 A | * | 3/1997 | Jeong ......................... 438/146 |
| 5,627,096 A | * | 5/1997 | Keigo ......................... 438/144 |
| 5,719,075 A | * | 2/1998 | Hawkins et al. ............... 438/75 |
| 5,741,728 A | * | 4/1998 | Kim ............................. 438/75 |
| 5,830,778 A | * | 11/1998 | Hatano et al. ................. 438/60 |
| 5,849,605 A | * | 12/1998 | Yamada ........................ 438/60 |

(List continued on next page.)

FOREIGN PATENT DOCUMENTS

| | | |
|---|---|---|
| JP | 62-71273 | 4/1987 |
| JP | 3-6836 | 1/1991 |
| JP | 4-247629 | 9/1992 |

OTHER PUBLICATIONS

C.K. Kim, "Two–Phase Charge Coupled Linear Imaging Devices with Self–Aligned Implanted Barrier", IEDM Technical Digest, 1974, pp. 55–58.

Japanese Office Action dated Jun. 1, 1999 with partial translation.

*Primary Examiner*—Matthew Smith
*Assistant Examiner*—Chuong A Luu
(74) *Attorney, Agent, or Firm*—McGinn & Gibb, PLLC

(57) ABSTRACT

In a charge transfer device of the two-layer electrode, two-phase drive type, an $N^{--}$ semiconductor region 108 and a first insulator film 103 are formed on a P-type semiconductor substrate 101 in the named order. Then, first transfer electrodes 104A are formed on the first insulator film 103, and a second insulator film 105 is formed on the surface of the $N^{--}$ semiconductor region 108 and a third insulator film 105 is formed on a top surface and a side surface of each first transfer electrode 104A. Phosphorus is ion-implanted with an incident angle of 0 degree, so that an N-type semiconductor region 102A is formed in $N^{--}$ semiconductor region 108 between the first transfer electrodes 104A in self-alignment. Second transfer electrodes 109A are formed, and an interlayer insulator 110 is formed on the whole, and metal interconnections 111-1A and 111-2A are formed. Thus, the potential recess occurring under the gap between the first transfer electrode and the second transfer electrode can be minimized or prevented. Accordingly, the drive voltage can be lowered without lowering the transfer efficiency of the signal charge.

13 Claims, 12 Drawing Sheets

U.S. PATENT DOCUMENTS

| | | | | |
|---|---|---|---|---|
| 5,858,811 A | * | 1/1999 | Tohyama | 438/75 |
| 5,861,642 A | * | 1/1999 | Nakashiba | 257/221 |
| 5,970,317 A | * | 10/1999 | Mizoguti et al. | 438/70 |
| 5,981,309 A | * | 11/1999 | Kim et al. | 438/60 |
| 6,090,640 A | * | 7/2000 | Ogawa | 438/78 |
| 6,097,044 A | * | 8/2000 | Nakashiba | 257/221 |
| 6,191,817 B1 | * | 2/2001 | Kanbe | 348/314 |
| 6,211,047 B1 | * | 4/2001 | Lee et al. | 438/587 |

* cited by examiner

US 6,380,005 B1

CHARGE TRANSFER DEVICE AND METHOD FOR MANUFACTURING THE SAME

The present Application is a Divisional Application of U.S. patent application Ser. No. 09/106,005, filed Jun. 29, 1998 now U.S. Pat. No. 6,097,044.

BACKGROUND OF THE INVENTION

1. Field of the Invention

The present invention relates to a charge transfer device and method for manufacturing the same, and more specifically to a charge transfer device of the two-layer electrode, two-phase drive type having charge storage regions and charge barrier regions formed in self-alignment with transfer electrodes, and a method for manufacturing the same.

2. Description of Related Art

At present, an image input device having a large number of pixels and a high degree of portability, such as a highly definition television camera and a digital still camera, is now actively developed.

For this image input device, it has become indispensable to develop a solid state image pickup device having a reduced power consumption. In particular, it has become a significant object to lower a drive voltage of a horizontal charge transfer section, which has a high drive frequency in the solid state image pickup device.

In general, the horizontal charge transfer section is constituted of a two-layer electrode, two-phase drive type charge transfer device, since it is necessary to transfer signal charges at a high speed.

Now, referring to FIGS. 1A to 1G, there are shown diagrammatic sectional views for illustrating a process for manufacturing the prior art two-layer electrode, two-phase drive type charge transfer device, which is disclosed in, for example, C. K. Kim, "TWO-PHASE CHARGE COUPLED LINEAR IMAGING DEVICES WITH SELF-ALIGNED IMPLANTED BARRIER", IEDM Technical Digest, 1974, pp55–58 (the content of which is incorporated by reference in its entirety into this application) and Japanese Patent Application Pre-examination Publication No. JP-A-62-071273, (an English abstract of JP-A-62-071273 is available from the Japanese Patent Office and the content of the English abstract of JP-A-62-071273 is incorporated by reference in its entirety into this application).

First, as shown in FIG. 1A, at a principal surface of a P-type semiconductor substrate 101 such as a P-type silicon substrate having an impurity concentration of about $1 \times 10^{15}$ $cm^{-3}$, there is formed an N-type semiconductor region 102 having the conductivity opposite to that of the substrate and having an impurity concentration of about $1 \times 10^{17}$ $cm^{-3}$, and also having the depth of about 0.5 $\mu m$ from the principal surface of the P-type semiconductor substrate 101. By a thermal oxidation, a first insulator film 103 having a thickness of about 100 nm is formed on a surface of the an N-type semiconductor region 102.

Next, as shown in FIG. 1B, on the first insulator film 103, a plurality of first charge transfer electrodes . . . , 104$i$, 104$j$, 104$k$, 104$l$, . . . , (represented by 104) are formed of polysilicon by a low pressure CVD (chemical vapor deposition) process to have a thickness of about 300 nm and to be located with a predetermined intervals.

Succeedingly, after the first insulator film 103 is selectively removed by using the first charge transfer electrodes 104 as a mask, a thermal oxidation is carried out again so that, as shown in FIG. 1C, a second insulator film 105 having a thickness of about 100 nm is formed on the surface of the N-type semiconductor region 102, and a third insulator film 106 having a thickness of about 200 nm because of an enhanced oxidation of the polysilicon is formed on a top surface and a side surface of each of the first charge transfer electrodes 104. Alternatively, by the CVD process causing $SiH_4$ gas and $H_2O$ gas to react, a second insulator film 105 having a thickness of about 100 nm is formed on the surface of the N-type semiconductor region 102, and a third insulator film 106 having a thickness of about 100 nm is formed on a top surface and a side surface of each of the first charge transfer electrodes 104.

Then, as shown in FIG. 1D, an impurity (for example, boron) of the conductivity opposite to that of the N-type semiconductor region 102 is selectively introduced using the first charge transfer electrodes 104 and the third insulator film 106 as a mask, by an ion-implantation having an incident angle of 0 (zero) degree, namely, perpendicular to the surface of the substrate, so that $N^{--}$ semiconductor regions 108 having an impurity concentration of about $8 \times 10^{16}$ $cm^{-3}$ are formed in self-alignment with the first charge transfer electrodes 104 and the third insulator film 106.

Thereafter, as shown in FIG. 1E, on the second insulator film 105 and the third insulator film 106, a plurality of second charge transfer electrodes . . . , 109$i$, 109$j$, 109$k$, 109$l$, . . . , (represented by 109) are formed of polysilicon by the low pressure CVD process to have a thickness of about 300 nm, and located with a predetermined intervals. Each of the second charge transfer electrodes 109 is formed to cover the $N^{--}$ semiconductor region 108 between each pair of adjacent first charge transfer electrodes 104, and to partially overlap on a near side end of each of the pair of adjacent first charge transfer electrodes 104.

Succeedingly, as shown in FIG. 1F, an interlayer insulator film 110 is formed to cover the whole. Then, not-shown through-holes are formed, and a not-shown aluminum film is deposited and patterned so that, as shown in FIG. 1G, a pair of metal interconnections 111-1 and 111-2 are alternately connected to transfer electrode pairs, each of which is composed of one first charge transfer electrode 104 (for example 104$i$) and one adjacent second charge transfer electrode 109 (for example 109$i$). In the shown example, transfer electrode pairs 104$j$+109$j$, 104$l$+109$l$ are connected to the metal interconnections 111-1 and transfer electrode pairs 104$i$+109$i$, 104$k$+109$k$ are connected to the metal interconnections 111-2.

In the above mentioned prior art charge transfer device of the two-layer electrode, two-phase drive type, signal charges can be transferred from the right to the left in the drawing, by driving the pair of metal interconnections 111-1 and 111-2 with a pair of transfer clock pulses $\phi_1$ and $\phi_2$ having the amplitude of about 5V and having the phase different from each other by 180 degrees as shown in FIG. 2, respectively.

However, the following problems have been encountered in the above mentioned prior art charge transfer device of the two-layer electrode, two-phase drive type. Since the N-type semiconductor region having the same impurity concentration is formed directly under the first charge transfer electrode and under the gap between the first charge transfer electrode and the second charge transfer electrode, in particular when it is attempted to transfer the signal charge with a low drive voltage (for example on the order of 3V), since the third insulator film 3 under the second charge transfer electrode in the area of the gap effectively acts as a thick insulator, a potential recess is easy to occur, and therefore, the transfer efficiency drops.

Referring to FIG. 3, there is shown a diagram for illustrating the problem of the above mentioned prior art charge transfer device of the two-layer electrode, two-phase drive type when the drive voltage is made low. In the diagram of FIG. 3, a potential diagram is combined with a sectional view of the charge transfer device in order to indicate a position in the coordinate. In addition, the dotted line indicates a potential diagram when the drive voltage is high (for example on the order of 5V) and the solid line indicates a potential diagram when the drive voltage is low (for example on the order of 3V).

The potential recess occurring due to the gap between the first transfer electrode and the second transfer electrode is modulated by a fringe electric field and therefore is suppressed, if a potential difference between portions directly under adjacent transfer electrodes is large. Namely, as shown in FIG. 3, when the drive voltage of the charge transfer device is sufficiently high (for example on the order of 5V in the prior art), and therefore, when the potential difference $\phi_2$ ($\phi_{21}$, $\phi_{22}$) is sufficiently large, the potential recess does not occur, and therefore, the signal charges are smoothly transferred.

On the other hand, if a potential difference between a portion directly under the first transfer electrode and a portion directly under an adjacent second transfer electrode becomes small, the potential recess becomes easy to occur, so that an inadequate transfer occurs. For example, as shown in FIG. 3, when the drive voltage of the charge transfer device is low (for example on the order of 3V in the prior art), and therefore, when the potential difference $\phi_1$ ($\phi_{11}$, $\phi_{12}$) is small, the potential difference $\phi_{11}$ between the portion directly under the first transfer electrode and the portion directly under the adjacent second transfer electrode supplied with the same voltage as that applied to the first transfer electrode, becomes small, and the potential difference $\phi_{12}$ between the portion directly under the first transfer electrode and the portion directly under the adjacent second transfer electrode supplied with the voltage different from that applied to the first the first transfer electrode, also becomes small. As a result, the recess "A" and "B" of potential occur under the gap of the first transfer electrode and the second transfer electrode adjacent to each other.

When the above mentioned potential recess occurs, not only the signal charge is trapped in the potential recess, but also the charge transfer electric field in the proximity of the potential recess becomes weak, with the result that the transfer of signal charge is dominantly carried out by the thermal diffusion, and therefore, the transfer time becomes very long. Accordingly, it becomes difficult to transfer the signal charge at a high speed, and the inadequate transfer becomes easy to occur.

Therefore, when the drive voltage of the charge transfer device is lowered, in order to perform the electric charge transfer with a high transfer efficiency and at a high speed, it is important to form the charge transfer device so as to minimize or prevent the above mentioned potential recess.

SUMMARY OF THE INVENTION

Accordingly, it is an object of the present invention to provide a charge transfer device and method for manufacturing the same, which have overcome the above mentioned defect of the conventional one.

Another object of the present invention is to provide a charge transfer device of the two-layer electrode, two-phase drive type capable of minimizing and preventing generation of the potential recess under the gap between the first transfer electrode and the second transfer electrode, thereby to be able to transfer the signal charge with a high transfer efficiency in any of a low voltage drive and a high voltage drive, and a method for manufacturing the same.

The above and other objects of the present invention are achieved in accordance with the present invention by a charge transfer device comprising:

a plurality of first transfer electrodes located with predetermined intervals, formed on a surface of a first insulator film formed on a semiconductor layer of a first conductivity type formed on a principal surface of a semiconductor substrate;

a second insulator film formed on the semiconductor layer of the first conductivity type between each pair of adjacent first transfer electrodes;

a third insulator film formed to cover a top surface and a side surface of each of the first transfer electrodes; and a plurality of second transfer electrodes each formed on the second insulator film between each pair of adjacent first transfer electrodes and having opposite ends to partially overlap an adjacent end of the pair of adjacent first transfer electrodes, the semiconductor layer of the first conductivity type including a first semiconductor region of a second conductivity type opposite to the first conductivity type, formed in self alignment, directly under each of the first transfer electrodes and the third insulator film formed to cover the side surface of the first transfer electrode, and a second semiconductor region of the second conductivity type formed, in self alignment, directly under the second insulator film between each pair of adjacent first transfer electrodes, the second semiconductor region having an impurity concentration higher than that of the first semiconductor region.

Here, the semiconductor layer of the first conductivity type can be constituted of a well of the first conductivity type formed at a surface of a semiconductor substrate of the second conductivity type, or of a semiconductor substrate of the first conductivity type.

In addition, a first transfer electrode pair composed of one first transfer electrode and one adjacent second transfer electrode and a second transfer electrode pair composed of one first transfer electrode and one adjacent second transfer electrode, are alternately located, and are driven with a first transfer clock and a second transfer clock opposite to each other in phase, respectively.

In one embodiment, the first semiconductor region of the second conductivity type formed directly under the first transfer electrode extends under the second insulator film on which there is located the second transfer electrode which cooperates the first transfer electrode to form the first transfer electrode pair. In this embodiment, the first semiconductor region extends under the second insulator film by a distance in the range of 0.5 times to 2.0 times of a thickness of the second insulator film.

In another embodiment, the second semiconductor region has a third semiconductor region formed at least one end of the second semiconductor region, in conjunction with the second semiconductor region, the third semiconductor region having an impurity concentration higher than that of the first semiconductor region but lower than the second semiconductor region. In this embodiment, the third semiconductor region has a size in the range of 0.5 times to 2.0 times of a thickness of the second insulator film.

In still another embodiment, the second semiconductor region has a third semiconductor region and a fourth semiconductor region formed at opposite ends of the second semiconductor region, respectively, in conjunction with the second semiconductor region, each of the third semiconductor region and the fourth semiconductor region having an impurity concentration higher than that of the first semiconductor region but lower than the second semiconductor region, but the third semiconductor region and the fourth semiconductor region being different from each other in at least one of the impurity concentration and the size. In this embodiment, each of the third semiconductor region and the fourth semiconductor region has a size in the range of 0.5 times to 2.0 times of a thickness of the second insulator film.

According to another aspect of the present invention, there is provided a method for manufacturing a charge transfer device comprising the steps:

preparing a semiconductor substrate having a semiconductor layer of a first conductivity type formed on a principal surface thereof;

forming a first semiconductor region of a second conductivity type opposite to the first conductivity type, in the semiconductor layer of the first conductivity type;

forming a first insulator film to cover the first semiconductor region of the second conductivity type;

forming a plurality of first transfer electrodes on the first insulator film, with predetermined intervals;

removing the first insulator film which is not covered with the first transfer electrodes;

forming a second insulator film to cover the first semiconductor region of the second conductivity type between each pair of adjacent first transfer electrodes, and a third insulator film to cover a top surface and a side surface of each of the first transfer electrodes;

introducing an impurity of the second conductivity type into the first semiconductor region of the second conductivity type, using the first transfer electrodes and the third insulator film as a mask, to form a second semiconductor region of the second conductivity type; and forming a plurality of second transfer electrodes each formed on the second insulator film on the second semiconductor region of the second conductivity type between each pair of adjacent first transfer electrodes and having opposite ends to partially overlap an adjacent end of the pair of adjacent first transfer electrodes.

In one embodiment, the ion implantation of the impurity of the second conductivity type is carried out at a desired incident angle inclined in a charge transfer direction so that the first semiconductor region of the second conductivity type remains to extend from under each of the first transfer electrodes and the third insulator film, to under the second insulator film on which there is located the second transfer electrode which cooperates the first transfer electrode to form a transfer electrode pair. In this embodiment, the first semiconductor region extends under the second insulator film by a distance in the range of 0.5 times to 2.0 times of a thickness of the second insulator film.

In another embodiment, the ion implantation of the impurity of the second conductivity type is carried out at a desired incident angle inclined in a charge transfer direction and at another desired incident angle inclined in a direction opposite to the charge transfer direction, so that a third semiconductor region and a fourth semiconductor region are formed at opposite ends of the second semiconductor region, respectively, in conjunction with the second semiconductor region. In this embodiment, each of the third semiconductor region and the fourth semiconductor region has a size in the range of 0.5 times to 2.0 times of a thickness of the second insulator film.

The semiconductor layer of the first conductivity type can be constituted of a well of the first conductivity type formed at a surface of a semiconductor substrate of the second conductivity type, or of a semiconductor substrate of the first conductivity type.

In addition, the second insulator film and the third insulator film can be formed in the same step. Alternatively, the second insulator film and the third insulator film can be formed of the same material.

With the above mentioned arrangement, since the second conductivity type semiconductor region having a low impurity concentration is formed in a self-alignment under the gap between the first transfer electrode and the second transfer electrode, the potential recess occurring under the gap can be minimized or prevented. Accordingly, the drive voltage can be lowered without lowering the transfer efficiency of the signal charge.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
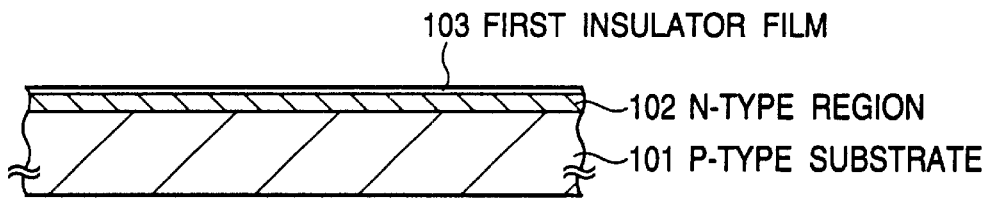
FIGS. 1A to 1G are diagrammatic sectional views for illustrating a process for manufacturing the prior art two-layer electrode, two-phase drive type charge transfer device.
Figure 1B:
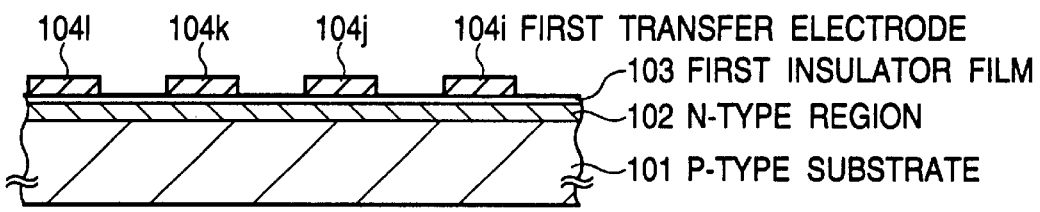
Figure 1C:
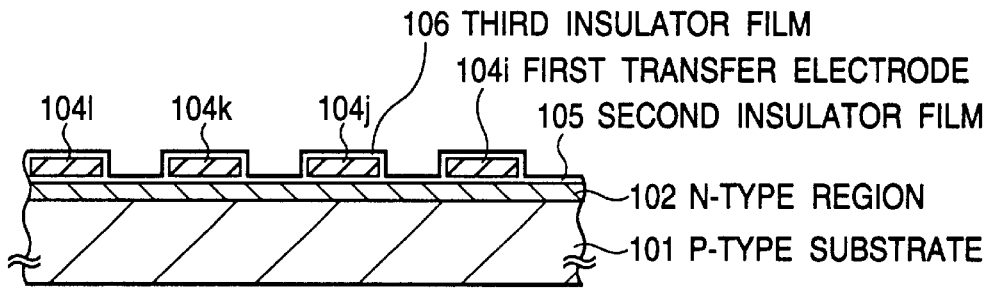
Figure 1D:
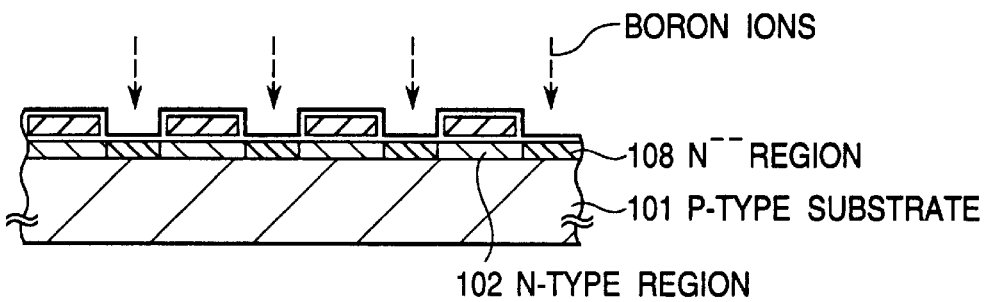
Figure 1E:
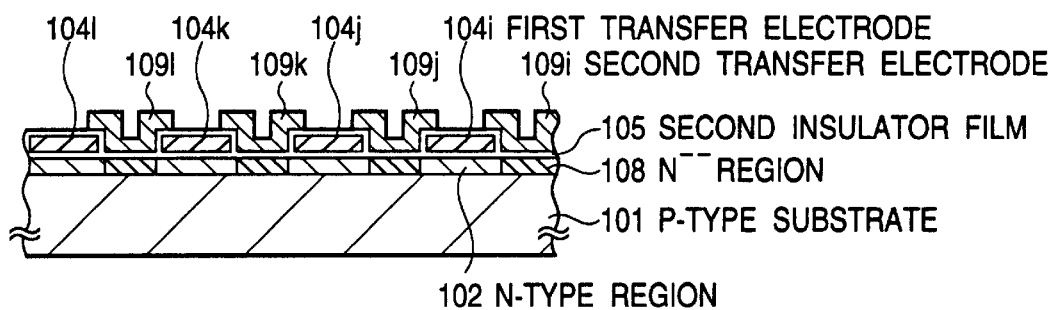
Figure 1F:
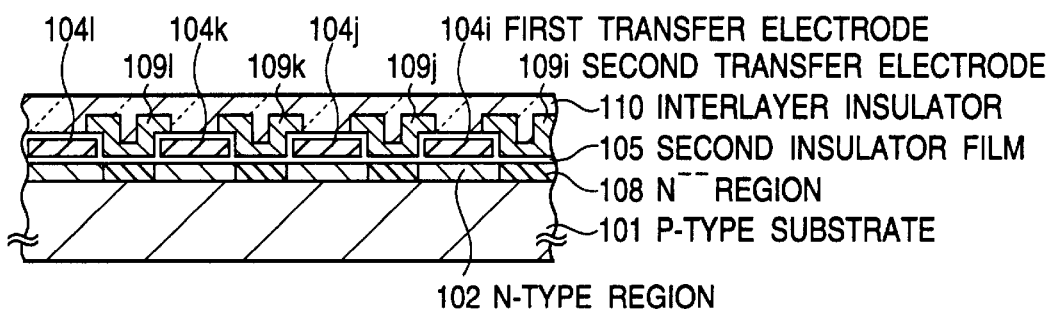
Figure 1G:
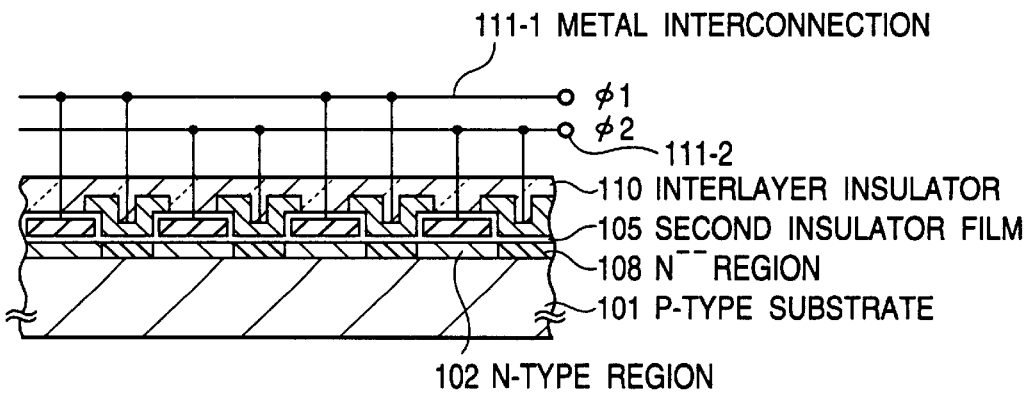

Now, a first embodiment of the present invention will be described with reference to the accompanying drawings.

FIGS. 4A to 4G are diagrammatic sectional views for illustrating a first embodiment of the process in accordance with the present invention for the buried channel charge transfer device of the two-layer electrode, two-phase drive type. In these drawings, elements similar to those shown in FIGS. 1A to 1G are given the same Reference Numerals.

Figure 4A:
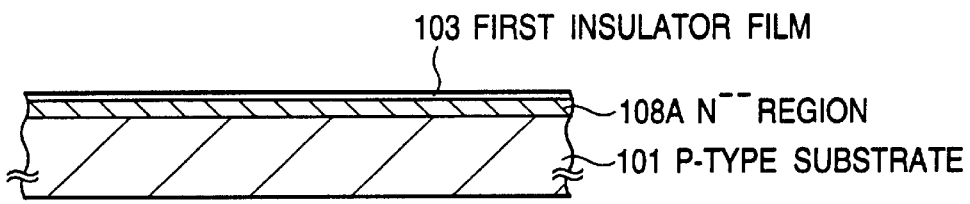
FIGS. 4A to 4G are diagrammatic sectional views for illustrating a first embodiment of the process in accordance with the present invention for manufacturing the two-layer electrode, two-phase drive type charge transfer device.

First, as shown in FIG. 4A, at a principal surface of a P-type semiconductor substrate 101 constituted of a P-type silicon substrate having an impurity concentration of about $1\times10^{15}$ cm$^{-3}$, there is formed an N$^{--}$ semiconductor region 108A having the conductivity opposite to that of the substrate and having an impurity concentration of about $8\times10^{16}$ cm$^{-3}$, and also having the depth of about 0.5 $\mu$m from the principal surface of the P-type semiconductor substrate 101. By a thermal oxidation, a first insulator film 103 having a thickness of about 100 nm is formed on a surface of the N$^{--}$ semiconductor region 108A.

Figure 4B:
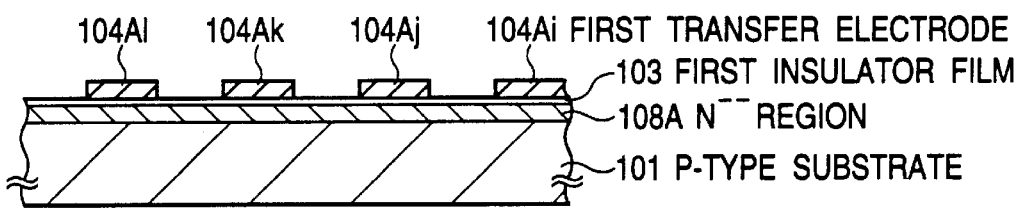

Next, as shown in FIG. 4B, a polysilicon layer having a thickness of about 300 nm is deposited on the first insulator film 103 by a low pressure CVD process, and then, is patterned to form a plurality of first charge transfer electrodes . . . , 104Ai, 104Aj, 104Ak, 104Al, . . . , (represented by 104A) which are located with a predetermined intervals.

Figure 4C:
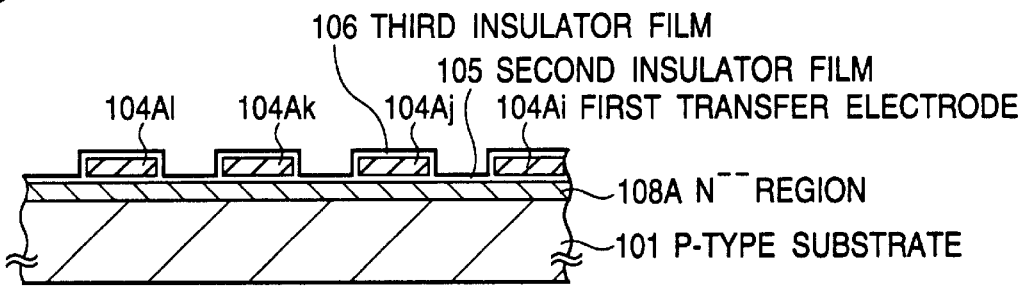

Succeedingly, after the first insulator film 103 is selectively removed by using the first charge transfer electrodes 104A as a mask, a thermal oxidation is carried out again so that, as shown in FIG. 4C, a second insulator film 105 having a thickness of about 100 nm is formed on the surface of the N$^{--}$ semiconductor region 108A, and a third insulator film 106 having a thickness of about 200 nm because of an enhanced oxidation of the polysilicon is formed on a top surface and a side surface of each of the first charge transfer electrodes 104A.

Here, alternatively, by the CVD process causing SiH$_4$ gas and H$_2$O gas to react, a second insulator film 105 having a thickness of about 100 nm is formed on the surface of the N$^{--}$ semiconductor region 108A, and a third insulator film 106 having a thickness of about 100 nm can be formed on a top surface and a side surface of each of the first charge transfer electrodes 104A.

Figure 4D:
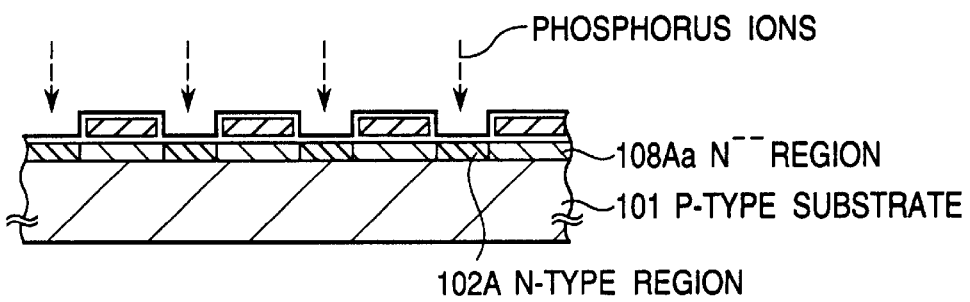

Then, as shown in FIG. 4D, an impurity (for example, phosphorus) of the same conductivity as that of the N$^{--}$ semiconductor region 108A is selectively introduced using the first charge transfer electrodes 104A and the third insulator film 106 formed on the side surface of the first charge transfer electrodes 104A, as a mask, by an ion-implantation having an incident angle of 0 (zero) degree, namely, perpendicular to the surface of the substrate, so that N-type semiconductor regions 102A (storage region) having an impurity concentration of about $1\times10^{17}$ cm$^{-3}$ are formed in the N$^{--}$ semiconductor region 108A between each pair of adjacent first charge transfer electrodes 104A, in self-alignment with the first charge transfer electrodes 104A and the third insulator film 106. Thus, the N$^{--}$ semiconductor region 108A is divided into a plurality of regions 108Aa.

Figure 4E:
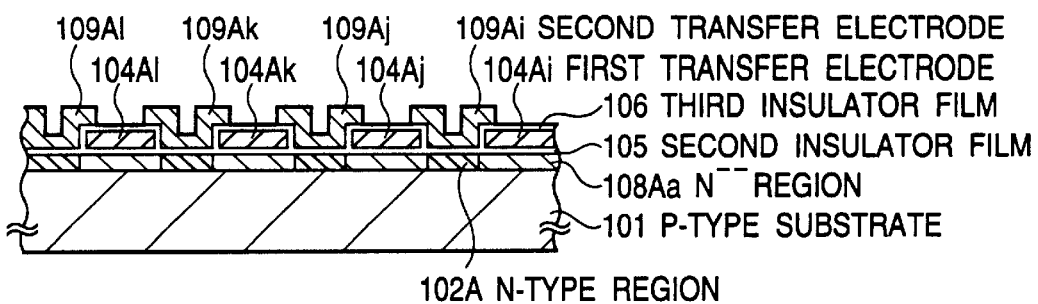

Thereafter, as shown in FIG. 4E, on the second insulator film 105 and the third insulator film 106, a polysilicon layer having a thickness of about 300 nm is deposited by a low pressure CVD process, and then, is patterned to form a plurality of second charge transfer electrodes . . . , 109Ai, 109Aj, 109Ak, 109Al, . . . , (represented by 109A) having a thickness of about 300 nm, with a predetermined intervals. Each of the second charge transfer electrodes 109A is formed to cover the N-type semiconductor region 102A between each pair of adjacent first charge transfer electrodes 104A, and to partially overlap on a near side end of each of the pair of adjacent first charge transfer electrodes 104A.

Figure 4F:
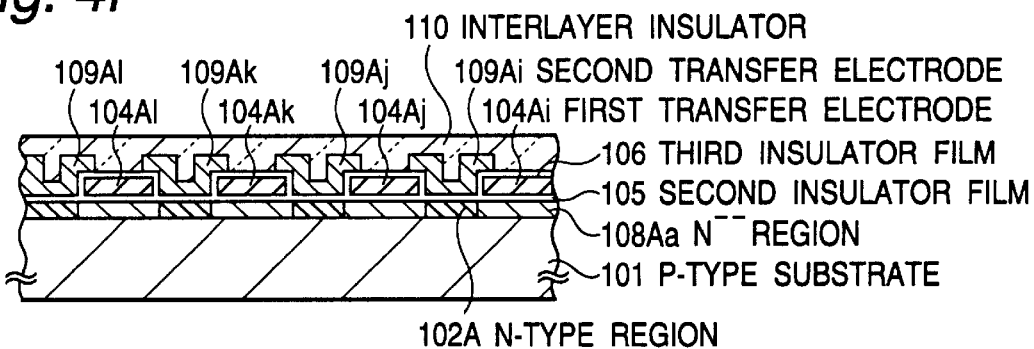
Figure 4G:
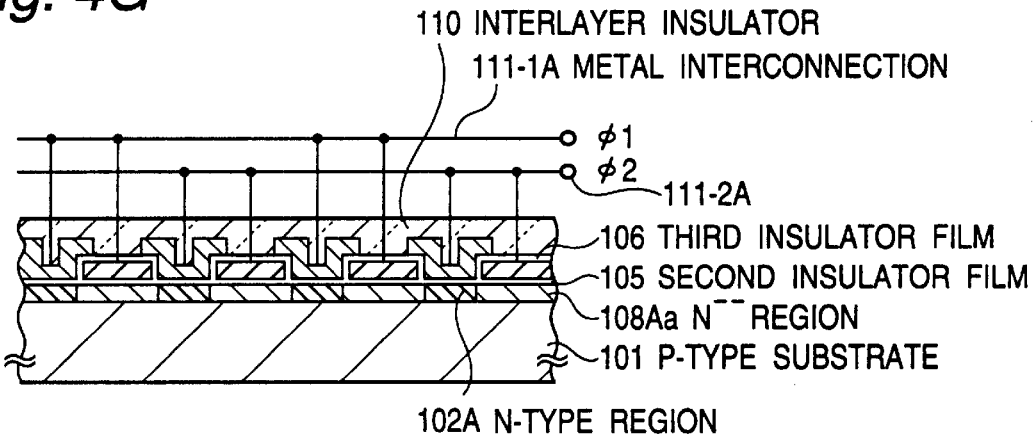

Succeedingly, as shown in FIG. 4F, an interlayer insulator film 110 is formed to cover the whole. Furthermore, not-shown through-holes are formed, and a not-shown aluminum film is deposited and patterned so that, as shown in FIG. 4G, a pair of metal interconnections 111-1A and 111-2A are alternately connected to transfer electrode pairs, each of which is composed of one first charge transfer electrode 104A (for example 104Ai) and one adjacent second charge transfer electrode 109A (for example 109Ai). In the shown embodiment, transfer electrode pairs 104Aj+109Aj, 104Al+109Al are connected to the metal interconnections 111-1A and transfer electrode pairs 104Ai+109Ai, 104Ak+109Ak are connected to the metal interconnections 111-2A.

Figure 2:
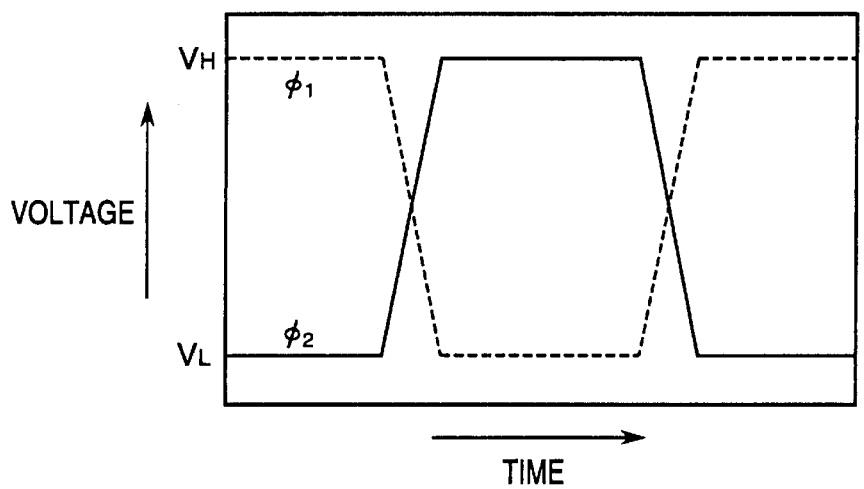
FIG. 2 illustrates a pair of transfer clock pulses $\phi_1$ and $\phi_2$ having the phase different from each other by 180 degrees.
Figure 3:
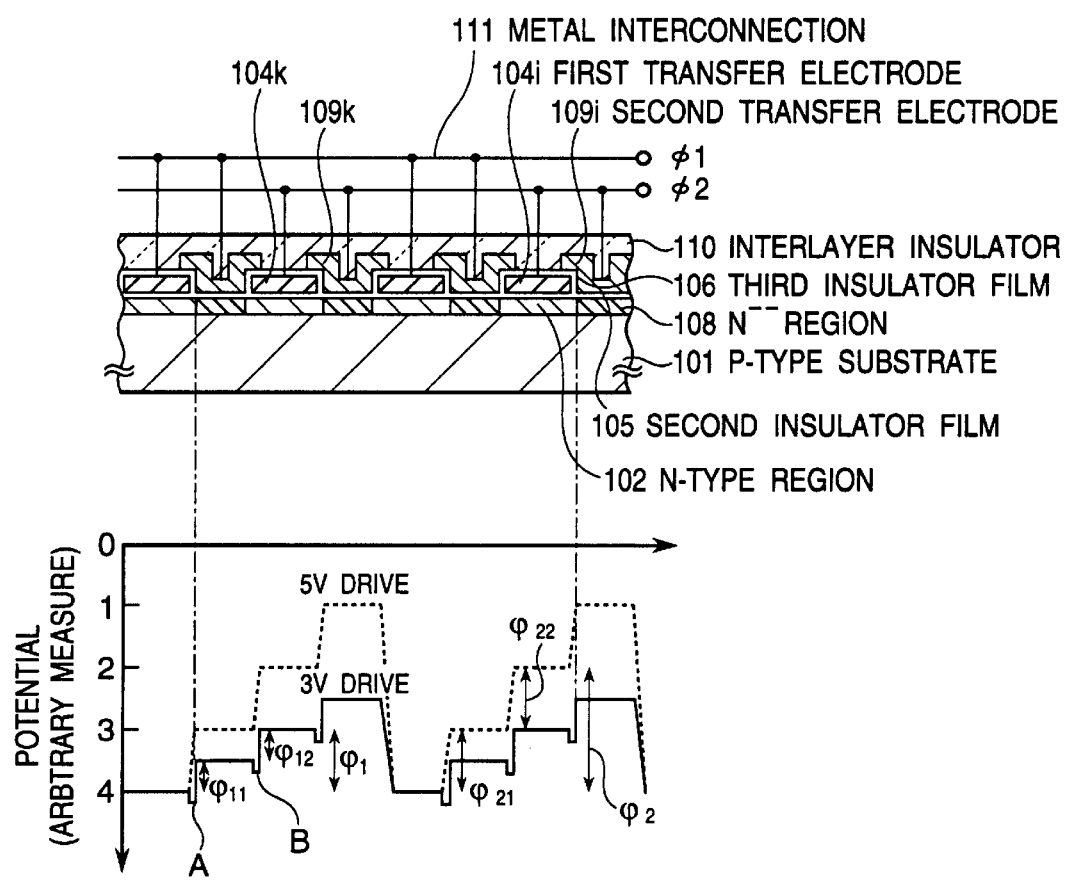
FIG. 3 is a potential diagram combined with a sectional view of the charge transfer device, for illustrating the potential diagrams of the prior art charge transfer device of the two-layer electrode, two-phase drive type charge when the drive voltage is high and when the drive voltage is low.

In the above mentioned first embodiment of the charge transfer device of the two-layer electrode, two-phase drive type in accordance with the present invention, similarly to the prior art mentioned hereinbefore, signal charges can be transferred from the right to the left in the drawing, by driving the pair of metal interconnections 111-1A and 111-2A with a pair of transfer clock pulses $\phi_1$ and $\phi_2$ having the phase different from each other by 180 degrees as shown in FIG. 2, respectively.

In the prior art mentioned hereinbefore with the reference to FIGS. 1A to 1G, each transfer electrode pair is constituted of each first transfer electrode and an adjacent second transfer electrode at a right side of the first transfer electrode in the drawing (namely, at an upstream side in a transfer direction), and the storage region is constituted of the N-type semiconductor region 102 directly under the first transfer electrode and the barrier region is constituted of the N$^{--}$ semiconductor region 108 directly under the second transfer electrode. In the shown embodiment, on the other hand, each transfer electrode pair is constituted of each first transfer electrode and an adjacent second transfer electrode at a left side of the first transfer electrode in the drawing (namely, at an upstream side in a transfer direction), and the storage region is constituted of the N-type semiconductor region 102A directly under the second transfer electrode and the barrier region is constituted of the N$^{--}$ semiconductor region 108Aa directly under the first transfer electrode and the third insulator film deposited on the side surface of the first transfer electrode.

Figure 5:
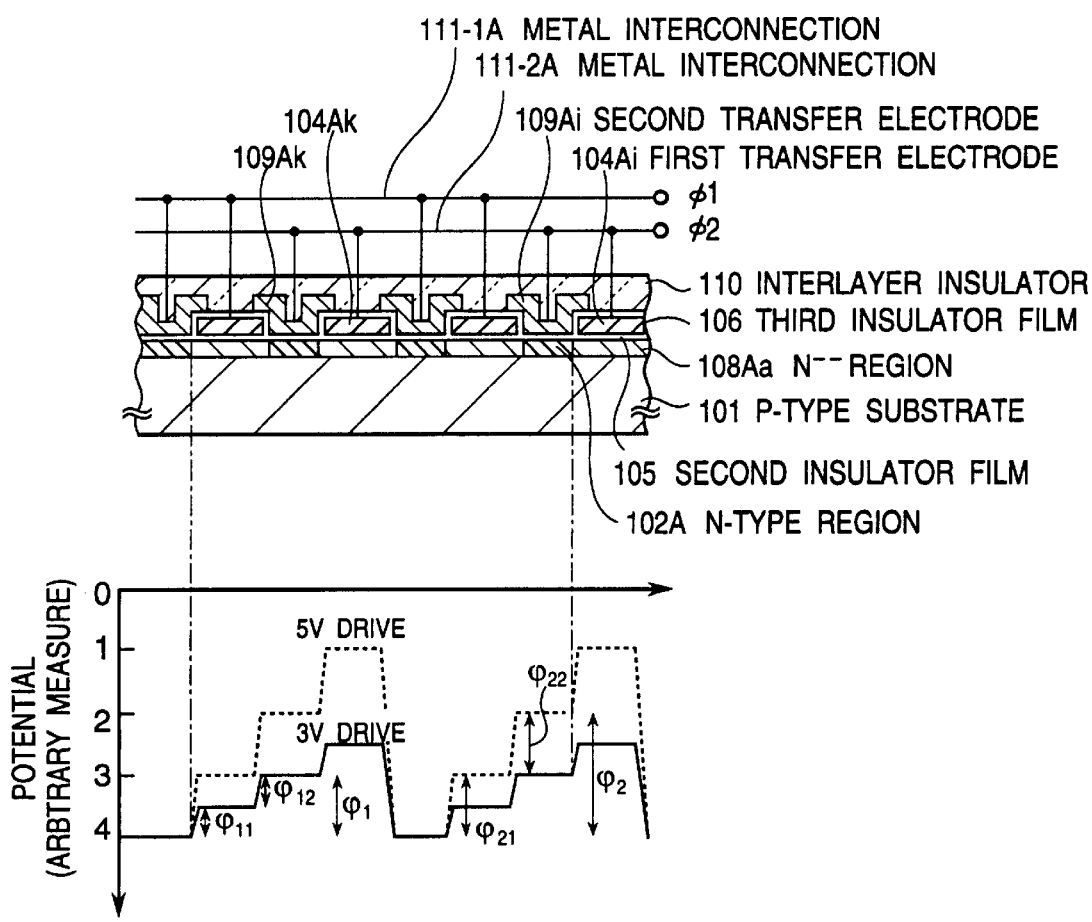
FIG. 5 is a potential diagram combined with a sectional view of the charge transfer device, for illustrating the potential diagrams of the charge transfer device of the two-layer electrode, two-phase drive type charge when the drive voltage is high and when the drive voltage is low.

FIG. 5 is a diagram combined with a sectional view of the charge transfer device in order to indicate a position in the coordinate, for illustrating an advantage of the above mentioned first embodiment of the charge transfer device of the two-layer electrode, two-phase drive type in which the drive voltage can be lowered. In the diagram of FIG. 5, the dotted line indicates a potential diagram when the drive voltage is high (for example on the order of 5V) and the solid line indicates a potential diagram when the drive voltage is low (for example on the order of 3V).

Since the N$^{--}$ semiconductor region 108Aa is formed in a self-alignment to extend not only under the first transfer electrode but also under the gap between the first transfer electrode and the second transfer electrode adjacent to the first transfer electrode (in the prior art, the barrier region does not extend under the gap in question), the potential recess occurring under the gap can be minimized or prevented. Accordingly, the drive voltage can be lowered without lowering the transfer efficiency of the signal charge.

Now, a second embodiment of the present invention will be described with reference to FIGS. 6A to 6G which are diagrammatic sectional views for illustrating a second embodiment of the process in accordance with the present invention for the buried channel charge transfer device of the two-layer electrode, two-phase drive type. In these drawings, elements similar to those shown in FIGS. 4A to 4G are given the same Reference Numerals.

Figure 6A:
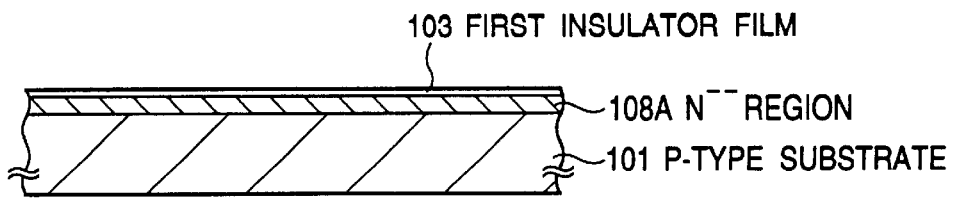
FIGS. 6A to 6G are diagrammatic sectional views for illustrating a second embodiment of the process in accordance with the present invention for manufacturing the two-layer electrode, two-phase drive type charge transfer device.
Figure 6B:
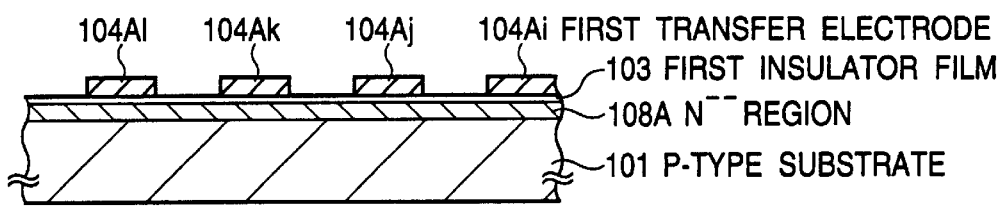
Figure 6C:
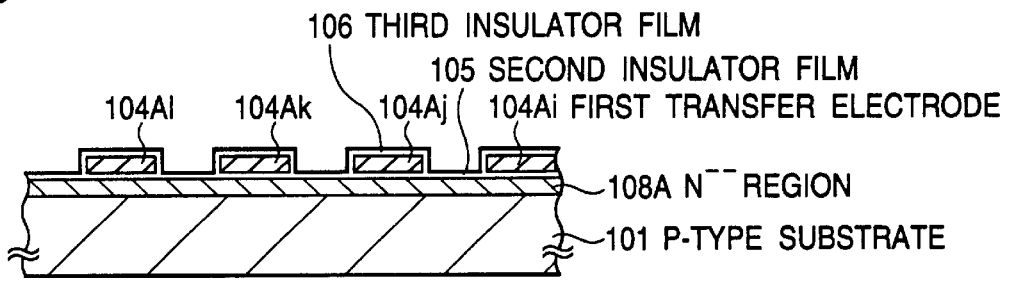

FIGS. 6A to 6C are the same as FIGS. 4A to 4C, and therefore, the process shown in FIGS. 6A to 6C is the same as that shown in FIGS. 4A to 4C. Namely, as shown in FIG. 6A, an $N^{--}$ semiconductor region 108A is formed on a principal surface of a P-type semiconductor substrate 101, and a first insulator film 103 is formed on a surface of the $N^{--}$ semiconductor region 108A. Then, a plurality of first charge transfer electrodes . . . , 104Ai, 104Aj, 104Ak, 104Al, . . . , (represented by 104A) are formed, and succeedingly, a second insulator film 105 and a third insulator film 106 are formed.

Figure 6D:
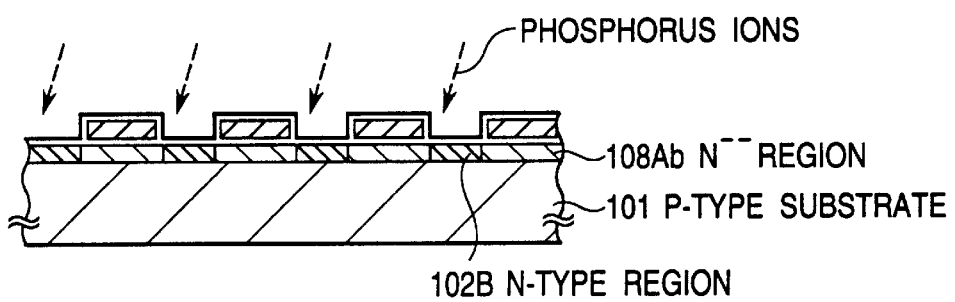

Thereafter, as shown in FIG. 6D, an impurity (for example, phosphorus) of the same conductivity as that of the $N^{--}$ semiconductor region 108A is selectively introduced using the first charge transfer electrodes 104A and the third insulator film 106 formed on the side surface of the first charge transfer electrodes 104A, as a mask, by an ion-implantation having an incident angle of 15 degree inclined toward an upstream side of the charge transfer direction from a direction perpendicular to the surface of the substrate, so that no impurity is introduced into the $N^{--}$ semiconductor region 108A, directly under each first transfer electrode 104A and the third insulator film 106 formed on the side surface of the first charge transfer electrodes 104A, and in a range of about 0.13 $\mu$m in a downstream direction of the charge transfer direction from an edge of the third insulator film 106 formed on the side surface of the first charge transfer electrodes 104A, and N-type semiconductor regions 102B (storage region) having an impurity concentration of about $1 \times 10^{17}$ cm$^{-3}$ are formed in the remaining region of the $N^{--}$ semiconductor region, in self-alignment with the first charge transfer electrodes 104A and the third insulator film 106. Thus, the $N^{--}$ semiconductor region 108A is divided into a plurality of regions 108Ab.

Figure 6E:
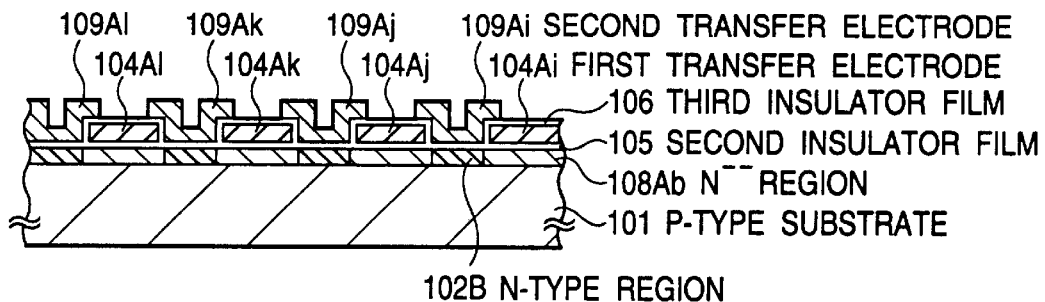
Figure 6F:
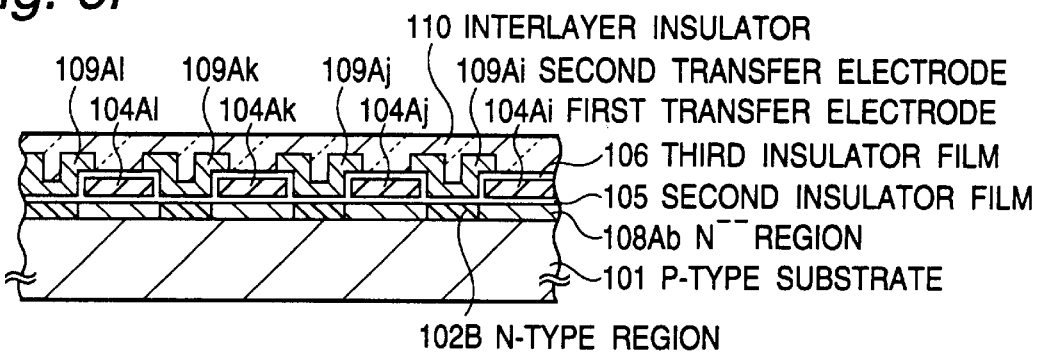
Figure 6G:
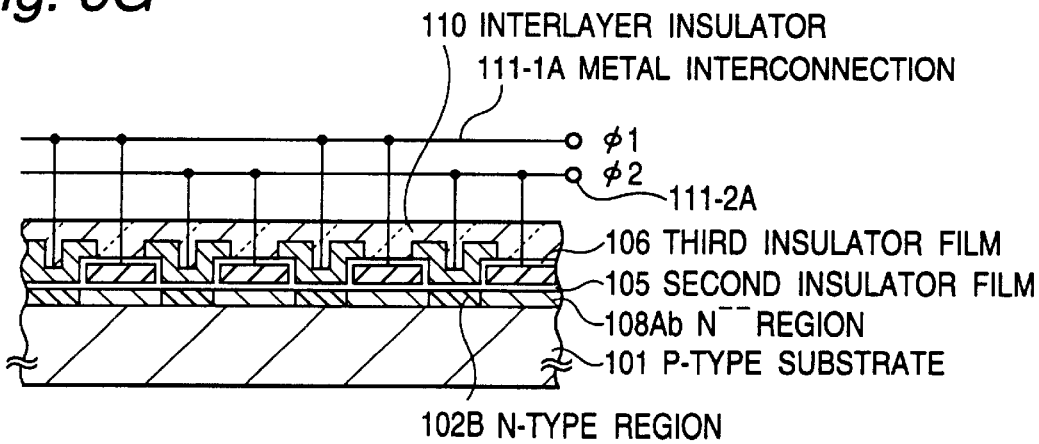

In the following, similarly to the first embodiment, as shown in FIG. 6E, on the second insulator film 105 and the third insulator film 106, a plurality of second charge transfer electrodes . . . , 109Ai, 109Aj, 109Ak, 109Al, . . . , (represented by 109A) of a polysilicon having the thickness of about 300 nm deposited by the low pressure CVD process, are formed, each to cover the N-type semiconductor region 102B between each pair of adjacent first charge transfer electrodes 104A, and to partially overlap on a near side end of each of the pair of adjacent first charge transfer electrodes 104A. Succeedingly, as shown in FIG. 6F, an interlayer insulator film 110 is formed to cover the whole, and as shown in FIG. 6G, a pair of metal interconnections 111-1A and 111-2A are formed.

Even in the above mentioned second embodiment of the charge transfer device of the two-layer electrode, two-phase drive type, signal charges can be transferred from the right to the left in the drawing, by driving the pair of metal interconnections 111-1A and 111-2A with a pair of transfer clock pulses $\phi_1$ and $\phi_2$ having the phase different from each other by 180 degrees as shown in FIG. 2, respectively.

In this second embodiment, the $N^{--}$ semiconductor region 108Ab extends not only directly under the first transfer electrode but also under the gap between the first transfer electrode and the second transfer electrode, similarly to the first embodiment (the shape of the $N^{--}$ semiconductor region 108Ab under the right end (upstream side end) of the first transfer electrode in the drawing is not substantially different from that in the first embodiment, since there is almost no influence of the slant ion implantation because the thickness of the second insulator film 105 is as thin as 100 nm). However, since the $N^{--}$ semiconductor region 108Ab is formed to extend into a region under the second insulator film covered with the second transfer electrode, slightly toward the downstream of the charge transfer direction, the potential recess occurring under the gap between the first transfer electrode and the second transfer electrode can further suppressed in comparison with the first embodiment. Therefore, the drive voltage can be further lowered without lowering the transfer efficiency of the signal charges.

In this second embodiment, the extension of the $N^{--}$ semiconductor region 108Ab into the region under the second insulating film 105 is on the order of 0.13 $\mu$m, however, this size (namely, the ion injecting angle) can be freely determined in the range of 0.5 times to 2.0 times of the thickness of the second insulator film.

Now, a third embodiment of the present invention will be described with reference to FIGS. 7A to 7G which are diagrammatic sectional views for illustrating a second embodiment of the process in accordance with the present invention for the buried channel charge transfer device of the two-layer electrode, two-phase drive type. In these drawings, elements similar to those shown in FIGS. 4A to 4G are given the same Reference Numerals.

Figure 7A:
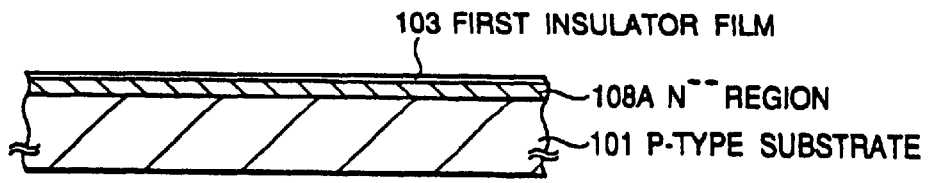
FIGS. 7A to 7G are diagrammatic sectional views for illustrating a third embodiment of the process in accordance with the present invention for manufacturing the two-layer electrode, two-phase drive type charge transfer device.
Figure 7B:
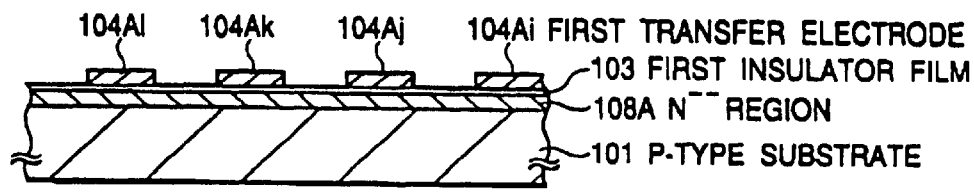
Figure 7C:
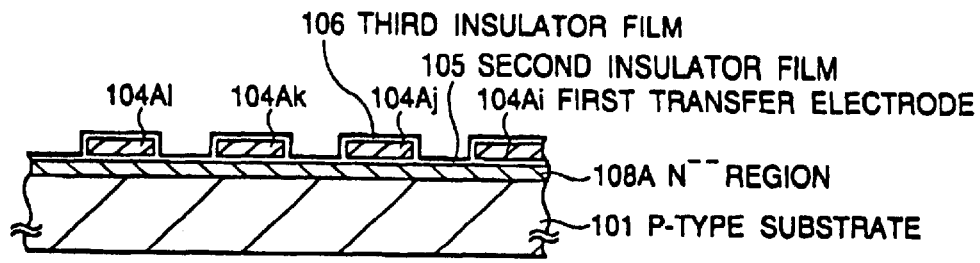

FIGS. 7A to 7C are the same as FIGS. 4A to 4C and FIGS. 6A to 6C, and therefore, the process shown in FIGS. 7A to 7C is the same as that shown in FIGS. 4A to 4C and in FIGS. 6A to 6C. Explanation of the process shown in FIGS. 7A to 7C will be omitted.

Figure 7D:
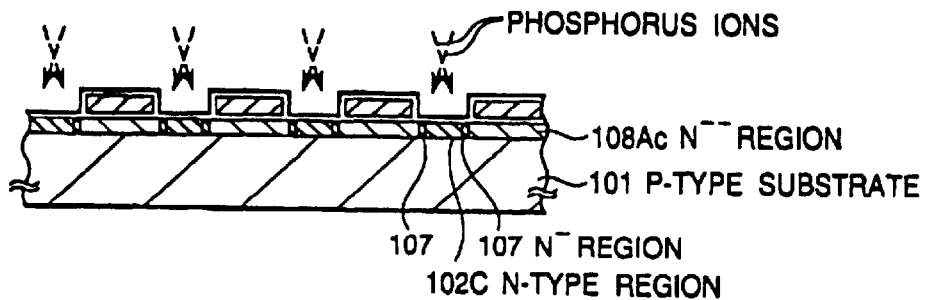

Thereafter, as shown in FIG. 7D, an impurity (for example, phosphorus) of the same conductivity as that of the $N^{--}$ semiconductor region 108A is selectively introduced using the first charge transfer electrodes 104A and the third insulator film 106 formed on the side surface of the first charge transfer electrodes 104A, as a mask, by an ion-implantation having an incident angle of 15 degree inclined toward an upstream side of the charge transfer direction from a direction perpendicular to the surface of the substrate, and by another ion-implantation having an incident angle of 15 degree inclined toward a downstream side of the charge transfer direction from the direction perpendicular to the surface of the substrate. The two ion-implantations are controlled to introduce the impurity of the same concentration. In this process, N-type semiconductor regions 102C (storage region) having an impurity concentration of about $1 \times 10^{17}$ cm$^{-3}$ are formed in the $N^{--}$ semiconductor region 108A in self-alignment with the first charge transfer electrodes 104A and the third insulator film 106. At this time, an $N^{--}$ semiconductor regions 107 having an impurity concentration of about $9 \times 10^{16}$ cm$^{-3}$ is formed at each side of each N-type semiconductor regions 102C. In addition, the $N^{--}$ semiconductor region 108A is divided into a plurality of regions 108Ac. The size of these regions 108Ac is equal to that of the regions 108Aa in the first embodiment. The size in the charge transfer direction of the $N^{--}$ semiconductor region 107 is preferably on the order of 0.13 $\mu$m, however, this size can be freely determined in the range of 0.5 times to 2.0 times of the thickness of the second insulator film.

Figure 7E:
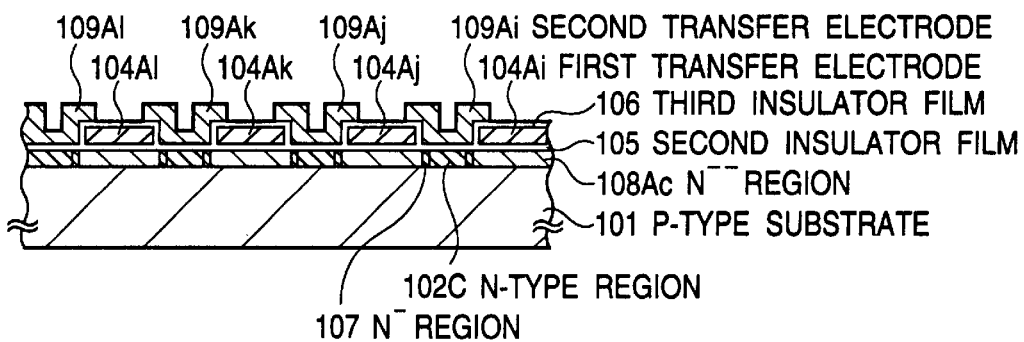
Figure 7F:
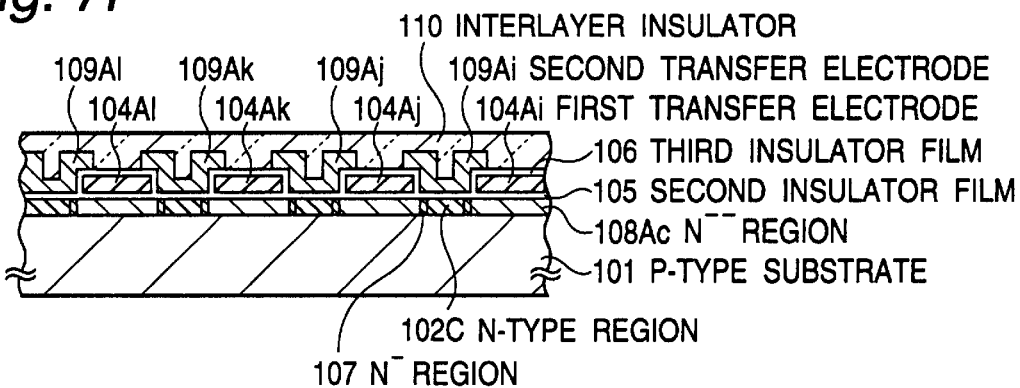
Figure 7G:
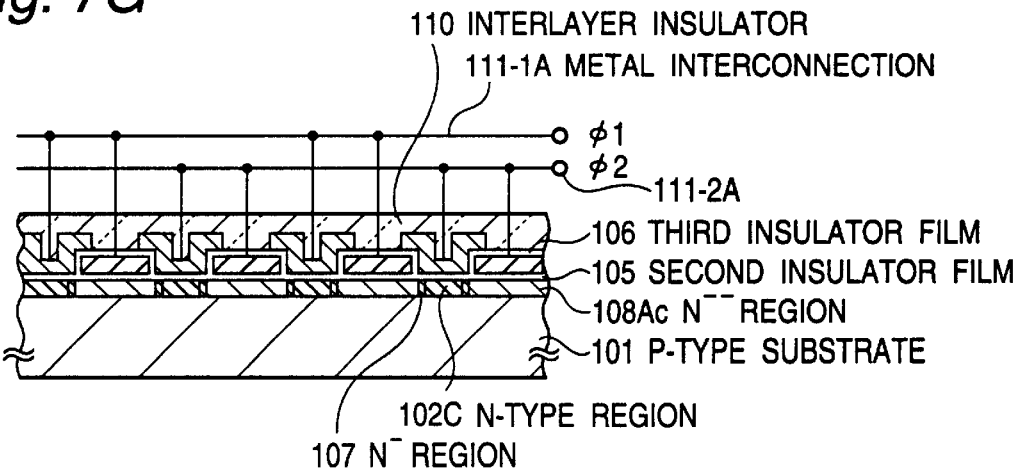

Next, as shown in FIG. 7E, on the second insulator film 105 and the third insulator film 106, a plurality of second charge transfer electrodes . . . , 109Ai, 109Aj, 109Ak, 109Al, . . . , (represented by 109A) are formed, and, as shown in FIG. 7F, an interlayer insulator film 110 is formed to cover the whole, and furthermore, as shown in FIG. 7G, a pair of metal interconnections 111-1A and 111-2A are formed.

Even in the above mentioned third embodiment of the charge transfer device of the two-layer electrode, two-phase drive type, signal charges can be transferred from the right to the left in the drawing, by driving the pair of metal interconnections 111-1A and 111-2A with a pair of transfer clock pulses $\phi_1$ and $\phi_2$ having the phase different from each other by 180 degrees as shown in FIG. 2, respectively.

In this third embodiment, not only the N$^{--}$ semiconductor region 108Ac extends not only directly under the first transfer electrode but also under the gap between the first transfer electrode and the second transfer electrode, but also the N$^-$ semiconductor regions 107 are formed in a self-alignment at opposite ends of the N-type semiconductor regions 102C (constituting the charge storage region) under the second transfer electrode. Therefore, the potential recess occurring under the gap between the first transfer electrode and the second transfer electrode can further suppressed in comparison with the first embodiment. Accordingly, the drive voltage can be further lowered without lowering the transfer efficiency of the signal charges.

Now, a fourth embodiment of the present invention will be described with reference to FIGS. 8A to 8G which are diagrammatic sectional views for illustrating a second embodiment of the process in accordance with the present invention for the buried channel charge transfer device of the two-layer electrode, two-phase drive type. In these drawings, elements similar to those shown in FIGS. 4A to 4G are given the same Reference Numerals.

Figure 8A:
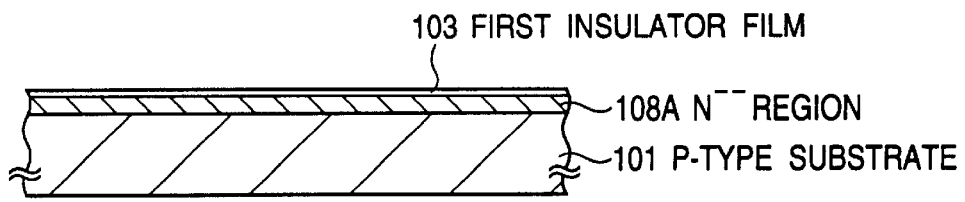
FIGS. 8A to 8G are diagrammatic sectional views for illustrating a fourth embodiment of the process in accordance with the present invention for manufacturing the two-layer electrode, two-phase drive type charge transfer device.
Figure 8B:
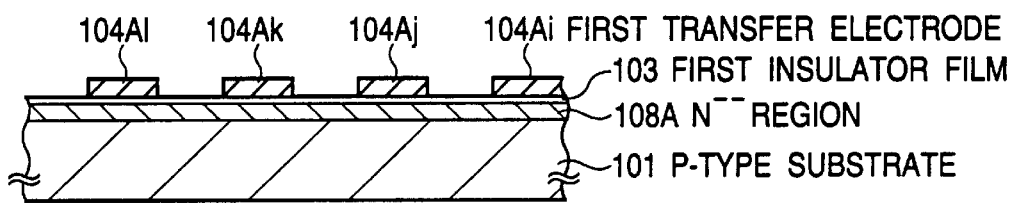
Figure 8C:
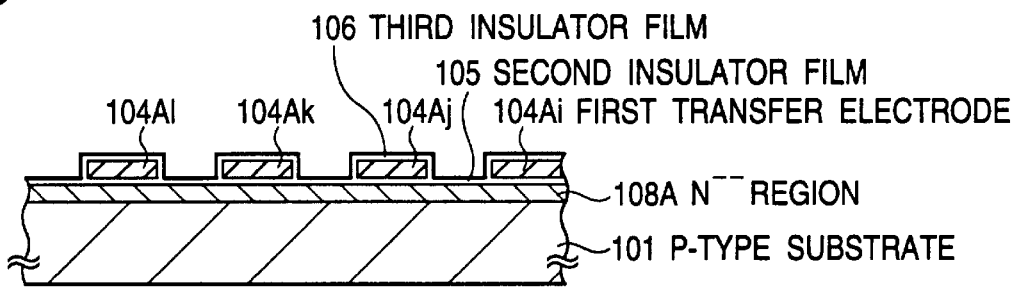

FIGS. 8A to 8C are the same as FIGS. 4A to 4C, and therefore, the process shown in FIGS. 8A to 8C is the same as that shown in FIGS. 4A to 4C. Explanation of the process shown in FIGS. 8A to 8C will be omitted.

Figure 8D:
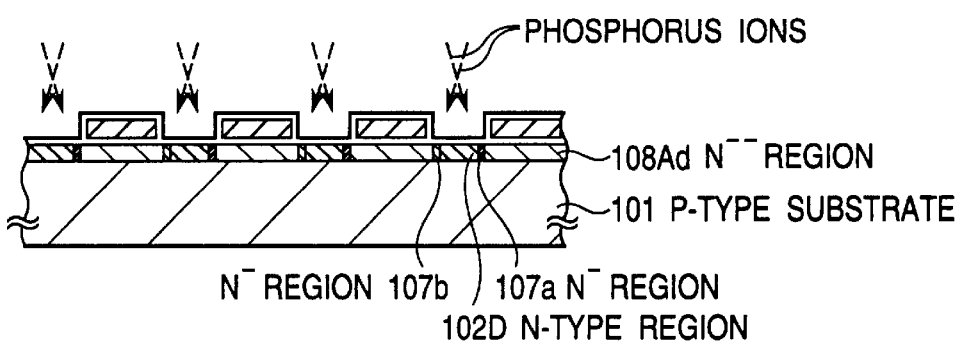

Thereafter, as shown in FIG. 8D, an impurity (for example, phosphorus) of the same conductivity as that of the N$^{--}$ semiconductor region 108A is selectively introduced using the first charge transfer electrodes 104A and the third insulator film 106 formed on the side surface of the first charge transfer electrodes 104A, as a mask, by an ion-implantation having an incident angle of 20 degree inclined toward a downstream side of the charge transfer direction from the direction perpendicular to the surface of the substrate, and by another ion-implantation having an incident angle of 15 degree inclined toward an upstream side of the charge transfer direction from the direction perpendicular to the surface of the substrate. The two ion-implantations are controlled to introduce the impurity of the different concentrations. In this process, N-type semiconductor regions 102D (storage region) having an impurity concentration of about 1×10$^{17}$ cm$^{-3}$ are formed in the N$^{--}$ semiconductor region 108A in self-alignment with the first charge transfer electrodes 104A and the third insulator film 106. At this time, an N$^-$ semiconductor region 107a having an impurity concentration of about 8.5×10$^{16}$ cm$^{-3}$ is formed at a charge transfer direction upstream side end of each N-type semiconductor regions 102D to extend over a region of 0.18 µm in the charge transfer direction, and an N$^-$ semiconductor region 107b having an impurity concentration of about 9.5×10$^{16}$ cm$^{-3}$ is formed at a charge transfer direction downstream side end of each N-type semiconductor regions 102D to extend over a region of 0.13 µm in the charge transfer direction. In addition, the N$^{--}$ semiconductor region 108A is divided into a plurality of regions 108Ad. The size in the charge transfer direction of the N$^-$ semiconductor regions 107a and 107b can be freely determined in the range of 0.5 times to 2.0 times of the thickness of the second insulator film.

Figure 8E:
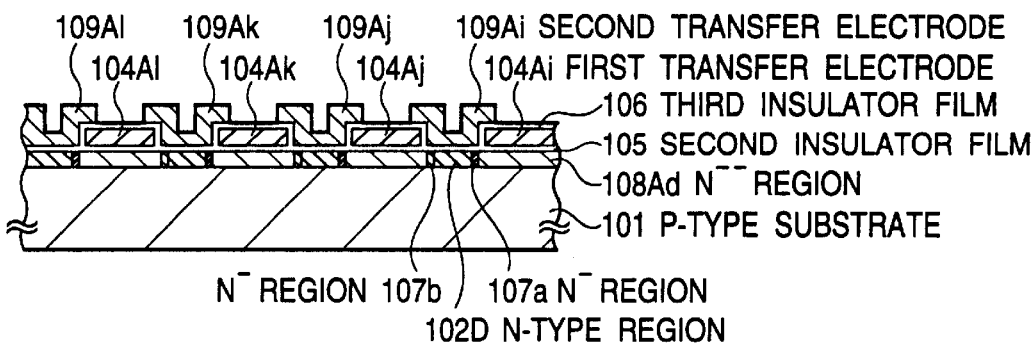
Figure 8F:
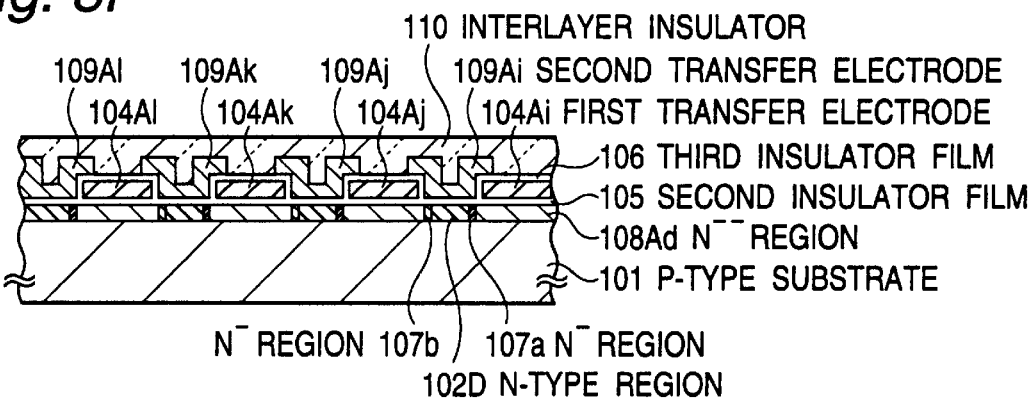
Figure 8G:
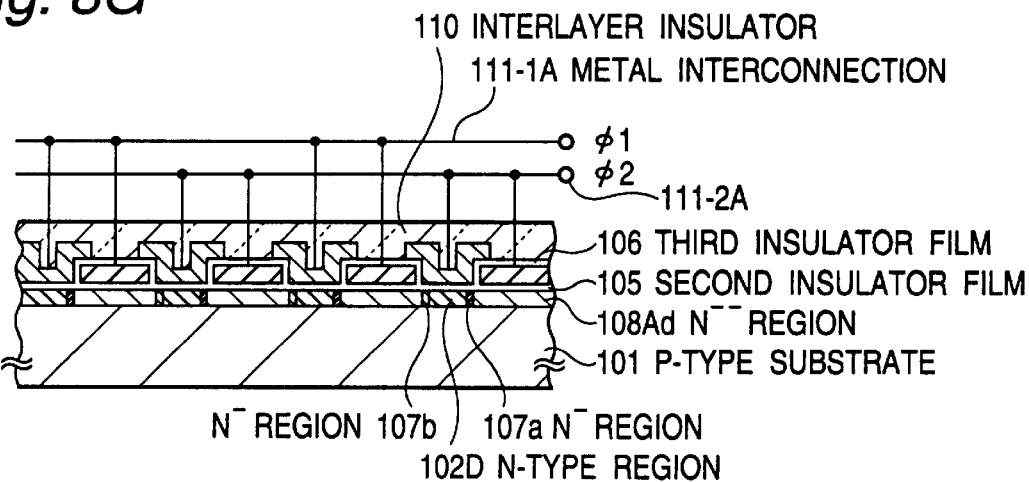

Next, as shown in FIG. 8E, on the second insulator film 105 and the third insulator film 106, a plurality of second charge transfer electrodes . . . , 109Ai, 109Aj, 109Ak, 109Al, . . . , (represented by 109A) are formed, and, as shown in FIG. 8F, an interlayer insulator film 110 is formed to cover the whole, and furthermore, as shown in FIG. 8G, a pair of metal interconnections 111-1A and 111-2A are formed.

Even in the above mentioned fourth embodiment of the charge transfer device of the two-layer electrode, two-phase drive type, signal charges can be transferred from the right to the left in the drawing, by driving the pair of metal interconnections 111-1A and 111-2A with a pair of transfer clock pulses $\phi_1$ and $\phi_2$ having the phase different from each other by 180 degrees as shown in FIG. 2, respectively.

In this third embodiment, not only the N$^{--}$ semiconductor region 108Ac extends not only directly under the first transfer electrode but also under the gap between the first transfer electrode and the second transfer electrode, but also the N$^-$ semiconductor regions 107a and 107b are formed in a self-alignment at opposite ends of the N-type semiconductor regions 102D (constituting the charge storage region) directly under the second transfer electrode. Therefore, the potential recess occurring under the gap between the first transfer electrode and the second transfer electrode can further suppressed in comparison with the first embodiment. Accordingly, the drive voltage can be further lowered without lowering the transfer efficiency of the signal charges.

The above mentioned first to fourth embodiments is the charge transfer device having the buried channel formed in the P-type semiconductor substrate. It would be a matter of course to persons skilled in the art that the present invention can be applied to a charge transfer device having a buried channel formed in an N-type semiconductor substrate.

In addition, in the mentioned first to fourth embodiments, the junction positions (junction depth) of the N$^{--}$ semiconductor regions, the N$^-$ semiconductor regions and the N-type semiconductor regions in the buried channel are the same to each other. It would be a matter of course to persons skilled in the art that the present invention can be applied similarly to a charge transfer device in which the junction positions (junction depth) of the N$^{--}$ semiconductor regions, the N$^-$ semiconductor regions and the N-type semiconductor regions in the buried channel are made different from each other.

In the fourth embodiment, by using the first transfer electrodes and the third insulator film formed on the side surface of the first transfer electrodes as the mask, a first conductivity type impurity is implanted into the first conductivity type semiconductor region from two different directions inclined in the charge transfer direction and in the opposite direction, respectively, at different injection angles, and with different concentrations. However, it would be a matter of course to persons skilled in the art that even if either the injection angles or the concentrations may be the same, the present invention can be applied similarly.

As mentioned above, in the charge transfer device of the two-layer electrode, two-phase drive type, according to the present invention, a second conductivity type semiconductor region having a low impurity concentration is formed in a self-alignment under the gap between the first transfer electrode and the second transfer electrode, the potential recess occurring under the gap can be minimized or prevented. Accordingly, the drive voltage can be lowered without lowering the transfer efficiency of the signal charge.

The invention has thus been shown and described with reference to the specific embodiments. However, it should be noted that the present invention is in no way limited to the details of the illustrated structures but changes and modifications may be made within the scope of the appended claims.

I claim:

1. A method for manufacturing a charge transfer device comprising the steps:

preparing a semiconductor substrate having a semiconductor layer of a first conductivity type formed on a principal surface thereof;

forming a first semiconductor region of a second conductivity type opposite to said first conductivity type, in said semiconductor layer of said first conductivity type;

forming a first insulator film to cover said first semiconductor region of said second conductivity type;

forming a plurality of first transfer electrodes on said first insulator film, with predetermined intervals;

removing said first insulator film which is not covered with said first transfer electrodes;

forming a second insulator film to cover said first semiconductor region of said second conductivity type between each pair of adjacent first transfer electrodes, and a third insulator film to cover a top surface and a side surface of each of said first transfer electrodes;

introducing an impurity of said second conductivity type into said first semiconductor region of said second conductivity type, using said first transfer electrodes and said third insulator film as a mask, to form a second semiconductor region of said second conductivity type; and forming a plurality of second transfer electrodes each formed on said second insulator film on said second semiconductor region of said second conductivity type between each pair of adjacent first transfer electrodes and having opposite ends to partially overlap an adjacent end of the pair of adjacent first transfer electrodes.

2. A method claimed in claim 1 wherein said ion implantation of said impurity of said second conductivity type is carried out at a desired incident angle inclined in a charge transfer direction so that said first semiconductor region of said second conductivity type remains to extend from under each of said first transfer electrodes and said third insulator film, to under said second insulator film on which there is located said second transfer electrode which cooperates said first transfer electrode to form a transfer electrode pair.

3. A charge transfer device claimed in claim 2 wherein said first semiconductor region extends under said second insulator film by a distance in the range of 0.5 times to 2.0 times of a thickness of said second insulator film.

4. A method claimed in claim 1 wherein said ion implantation of said impurity of said second conductivity type is carried out at a desired incident angle inclined in a charge transfer direction and at another desired incident angle inclined in a direction opposite to said charge transfer direction, so that a third semiconductor region and a fourth semiconductor region are formed at opposite ends of said second semiconductor region, respectively, in conjunction with said second semiconductor region.

5. A method claimed in claim 4 wherein each of said third semiconductor region and said fourth semiconductor region has a size in the range of 0.5 times to 2.0 times of a thickness of said second insulator film.

6. A method claimed in claim 1 wherein said semiconductor layer of said first conductivity type is constituted of a well of said first conductivity type formed at a surface of a semiconductor substrate of said second conductivity type, or of a semiconductor substrate of said first conductivity type.

7. A method claimed in claim 1 wherein said second insulator film and said third insulator film are formed in the same step.

8. A method claimed in claim 1 wherein said second insulator film and said third insulator film are formed of the same material.

9. A method claimed in claim 1, wherein the first conductivity type is a P-type conductivity type and the second conductivity type is an N-type conductivity type.

10. A method claimed in claim 1, wherein the impurity of said second conductivity type comprises phosphorous ions.

11. A method claimed in claim 10, wherein the first conductivity type is a P-type conductivity type and the second conductivity type is an N-type conductivity type.

12. A method claimed in claim 1, wherein each of said first charge transfer electrodes is formed to cover an N−− type semiconductor region and each of the second charge transfer electrodes is formed to cover an N-type semiconductor region.

13. A method claimed in claim 1, wherein the first semiconductor region comprises an N−− region and the second semiconductor region comprises an N− region.

* * * * *